United States Patent
Haze et al.

(10) Patent No.: US 6,766,576 B2
(45) Date of Patent: Jul. 27, 2004

(54) METHOD FOR PRODUCING A DOUBLE-SIDED WIRING BOARD

(75) Inventors: Takayuki Haze, Kyoto-fu (JP); Tsuneo Yabuuchi, Shiga-ken (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/435,279

(22) Filed: May 9, 2003

(65) Prior Publication Data

US 2003/0188429 A1 Oct. 9, 2003

Related U.S. Application Data

(62) Division of application No. 09/358,365, filed on Jul. 21, 1999, now Pat. No. 6,571,467.

(30) Foreign Application Priority Data

Sep. 18, 1998 (JP) ............................................. 19-264124

(51) Int. Cl.[7] ............................................. H01K 3/10
(52) U.S. Cl. ............................. 29/852; 29/846; 29/842; 29/830; 427/97; 205/209; 174/262; 361/748; 216/18
(58) Field of Search ......................... 29/852, 846, 842, 29/830; 427/97; 205/205, 209; 174/262, 266; 361/780, 794, 748; 216/17, 18; 438/687, 635, 680

(56) References Cited

U.S. PATENT DOCUMENTS

| | | | | |
|---|---|---|---|---|
| 4,891,157 A | * | 1/1990 | dePaz et al. | 252/373 |
| 5,076,864 A | * | 12/1991 | Tanaka et al. | 148/269 |
| 5,383,093 A | * | 1/1995 | Nagasaka | 361/771 |
| 5,578,341 A | * | 11/1996 | Hirosawa | 427/97 |
| 5,753,309 A | * | 5/1998 | Fakler et al. | 427/399 |
| 5,861,076 A | * | 1/1999 | Adlam et al. | 156/281 |
| 5,897,724 A | * | 4/1999 | Nagasaka | 156/89.18 |
| 5,953,634 A | * | 9/1999 | Kajita et al. | 438/687 |

FOREIGN PATENT DOCUMENTS

| | | |
|---|---|---|
| JP | 3-184396 | 8/1991 |
| JP | 3-263393 | 11/1991 |
| JP | 09167891 | 6/1997 |
| JP | 64-8479 | 7/1997 |
| JP | 09064546 | 7/1997 |
| JP | 63702 A * | 2/2000 |

* cited by examiner

Primary Examiner—Richard Chang
(74) Attorney, Agent, or Firm—William N. Hogg

(57) ABSTRACT

The method for producing a printed wiring board comprising the steps of preparing a conductive substrate, forming an insulating layer on one surface of the said substrate, forming at least one via hole in the insulating layer, thermally curing the insulating layer, and reducing at least one oxidized layer formed on the other conductive surface of the substrate during the curing operation. Alternatively, the thermal cure may be accomplished in an atmosphere (e.g., reducing gas, inactive gas, or mixtures thereof) not conducive to oxide formation on metallized circuit surfaces.

11 Claims, 8 Drawing Sheets

FIG. 7 (a) PRIOR ART
FIG. 7 (b) PRIOR ART
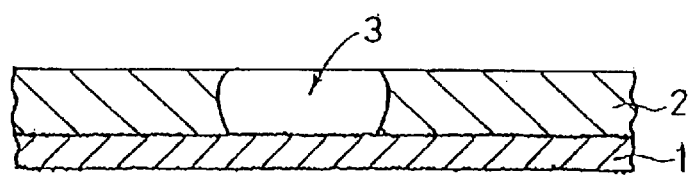
FIG. 7 (c) PRIOR ART
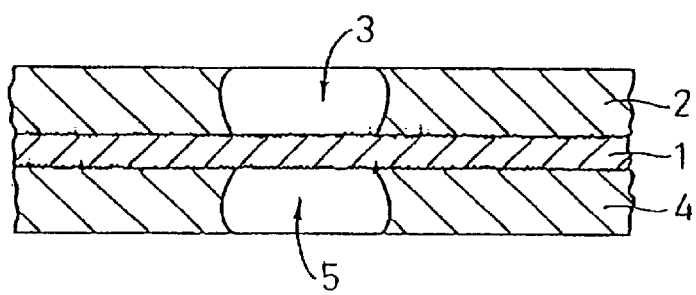
FIG. 7 (d) PRIOR ART
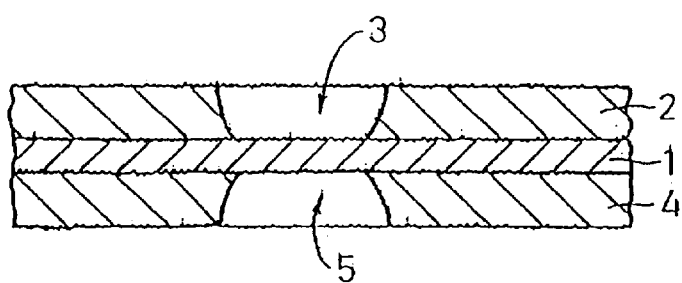
FIG. 7 (e) PRIOR ART
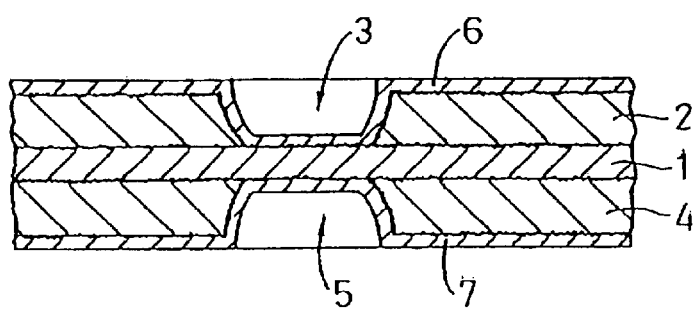

METHOD FOR PRODUCING A DOUBLE-SIDED WIRING BOARD

CROSS REFERENCE TO RELATED APPLICATION

This application is a divisional of application Ser. No. 09/358,365, filed Jul. 21, 1999 now U.S. Pat. No. 6,571,467.

TECHNICAL FIELD

The present invention relates to a method for producing double-sided wiring boards including surface layer printed wiring boards and multi-layer double-sided wiring boards. More particularly, the invention relates to a method for forming wiring boards having high density circuits.

BACKGROUND OF THE INVENTION

Referencing FIGS. 7–11 of the drawings, a conventional double-sided wiring board is produced as follows. First, a surface of copper foil 1 with a thickness of a few to tens of micrometers is roughened as shown in FIG. 7(a). A double-sided copper-clad laminate can be used in place of the copper foil 1. Then, as shown in FIG. 7(b), after one surface of the copper foil 1 is coated with photosensitive insulating resin 2, one or more via holes 3 are formed at predetermined positions of the coated photosensitive insulating resin 2, and then the coated resin 2 is thermally cured. Next, as shown in FIG. 7(c), after the back surface of the copper foil 1 is coated with photosensitive insulating resin 4, one or more via holes 5 are formed at predetermined positions of the coated photosensitive resin 4, and then the coated resin 4 is thermally cured. After surfaces of the thermally-cured photosensitive insulating resins 2 and 4 on both surfaces of the copper foil 1 are smoothened and roughened as shown in FIG. 7(d), these surfaces are plated with copper to form circuit copper layers 6 and 7 as shown in FIG. 7(e).

In the above copper-plating process, the copper foil 1, on both surfaces of which the described photosensitive insulating resin layers 2 and 4 are formed, is immersed in a copper plating solution. However, as shown in the enlarged view of FIG. 8, a portion of the bottom part of the back surface of the copper foil 1, which is exposed by the via hole 5, is dissolved away, resulting in what is referred to as "haloing" (8) wherein an open portion is formed as shown in FIG. 8. Please see more about this below. As a result, the via hole 5 on which this haloing is generated is poorly plated with copper. In order to solve this problem, the thicknesses of the copper layers 6 and 7, including the haloed part 8, is increased by a second copper plating, as shown in FIG. 9. Then, the circuits 9 are formed from the copper layers 6 and 7 by applying a known photo-etching method. The result: a double-sided wiring board (10).

As stated, in the above-mentioned method, it is necessary to thicken the copper-plated layers 6 and 7. However, doing so makes it difficult to form circuits 9 comprising fine lines. When the copper layers 6 and 7 are formed on the photosensitive insulating resins 2 and 4 by plating these resin surfaces with copper after via holes 3 and 5 are formed in the photosensitive insulating resins on both surfaces of the copper foil 1, immersion of this structure in acidic solution (used as a catalyst in the chemical copper-plating process), results in the copper of the interface between the insulating layer 4 and the copper foil 1 (on the via hole) being dissolved. Thus, haloing occurs. As a result of such haloing, the contact surface between the copper layer 7 of the inner surface of the via hole 5 and the copper foil 1 of the bottom of the via hole 5 is not plated sufficiently with copper from only one copper plating. Thus, the thickness of the copper plating does not meet the standard, and reliability of the product cannot be secured. To solve this problem, a second copper plating process is implemented to secure enough thickness of copper plated layers 6 and 7 at the bottom of the via hole 5. As a result, the copper-plated layers 6 and 7 on the surface layer are also thickened. As stated, such thick layers make high density, fine wiring extremely difficult.

When haloing occurs at the bottom (the top in FIG. 8) of the via holes 5, adhesive strength between the insulating resin 4 and the copper foil 1 is obviously diminished. Accordingly, as shown in FIG. 11, if spaces between via holes 5 are narrowed, the haloing 8 of via holes 5 may overlap each other, so that the adhesive strength between the insulating resin 4 and the copper foil 1 in the haloed parts 8 is even further diminished. In consequence; thermal stress in a soldering process may cause the peeling of copper foil 1 and insulating resin 4, as well as the degradation of the resin's insulating properties.

For producing even greater density boas, both surfaces of the produced double-sided wiring board 10 are coated with photosensitive insulating resins 11 and 12, preferably by the same process described above. The result: a double-sided wiring board 13 having circuits 9 in multi-layers as shown in FIG. 10. In such production, the resin 12 cannot be filled into the via hole 5 on the back surface when the surface of the circuit 7 on the back surface are coated with the photosensitive insulating resin 12 because a "bubble" 14 may be generated inside of the hole (FIG. 10). Therefore, as the number of via holes 5 or layers having the via holes 5 is increased, a supplementary step of filling photosensitive insulating resin 12 to remove this open spacing ("bubble") must be utilized. For this reason, it has been difficult to increase board productivity.

As the result of a preliminary investigation, a Japanese Patent Publication (No. 64-8479) related to haloing was located. According to this publication, a chemical process for forming film of cupric oxide and then roughening said film surface is executed in order to improve adhesive strength between a copper foil circuit of a inner-layer printed wiring board comprising a copper-clad laminate board and a prepreg. However, in the chemical copper plating process, haloing may be generated on the wall of the through-hole(s). To solve this problem, this Japanese Patent Publication mentions roughening the copper-foil-circuit surface without damaging projections and forming recesses on the surface (and spoiling affinity) by using a solution of alkaline reducing agent to reduce cupric oxide film into cuprous oxide or copper metal.

DISCLOSURE OF THE INVENTION

An object of the present invention is to provide a method for producing a double-sided wiring board wherein a multi-layered conductive layer can be formed without haloing being generated.

Another object of the present invention is to provide a method for producing a double-sided wiring board wherein a via hole can be coated with insulating resin without any bubbles being formed is the hole during the process of making the board.

A further object of the present invention is to provide a method for producing a double-sided wiring board. More than one conductive layer can be formed without any haloing being generated in the process of producing the board.

According to one aspect of the invention, there is defined a method for producing a double-sided printed wiring board which comprises the steps of providing a conductive substrate having first and second opposed conductive surfaces, forming a first insulating layer on the first conductive surface of the substrate, forming at least one via hole in the first insulating layer on the first conductive surface, thermally curing the first insulating layer on the first conductive surface, resulting in the second conductive surface having a first oxidized layer thereon, removing the oxidized layer formed on the second conductive surface of the conductive substrate, forming a second insulating layer on the second conductive surface of the conductive substrate from which the first oxidized layer is removed, forming at least one via hole in the second insulating layer and forming conductive wiring on the surfaces of both of the first and second insulating layers.

According to another aspect of the invention, there is defined a method for producing the double-sided wiring board comprising the steps of providing a conductive substrate having first and second opposed conductive surfaces, forming an insulating layer on the first conductive surface of the substrate, forming at least one via hole in the first insulating layer on the first conductive surface, thermally curing the first insulating layer in a reducing gas, inactive gas, or a mixture of these gases so as to prevent an oxidized layer from being formed on the second conductive layer of the substrate during the thermally curing step, forming a second insulating layer on the second conductive surface of the conductive substrate, forming at least one via hole in the second insulating layer and forming conductive wiring on the surfaces of both the first and second insulating layers.

According to another aspect of the invention, there is defined a method for producing the multilayered double-sided wiring board comprising the steps of forming a first insulating layer on the conductive wiring on one surface of the opposite surfaces of the double-sided wiring board, forming at least one via hole in the first insulating layer, thermally curing the first insulating layer, resulting in the conductive wiring on the other of the opposite surface having an oxidized layer thereon, removing the oxidized layer, forming a second insulating layer on the wiring on the other surface of the double-sided wiring board, forming at least one via hole in the second insulating layer and forming wiring on the surfaces of both the first and second insulating layers.

BRIEF DESCRIPTION OF THE DRAWINGS

FIGS. 1(a) to 3(b) are sectional views showing the preferred steps for making a double-sided wiring board according to the present invention;

FIGS. 4(a) to 5(b) are sectional views showing additional steps that can be implemented to provide a double-sided wiring board of greater density (mom wiring layers) than that produced in FIGS. 1(a) to 3(b);

FIGS. 7(a) to 10 are sectional views showing the afore-described conventional method for producing a double-sided wiring board.

BEST MODE FOR CARRYING OUT THE INVENTION

Referring to the accompanying drawings, embodiments of the method for producing a double-sided printed wiring board according to the present invention are described below.

Figure 1:
Figure 1:
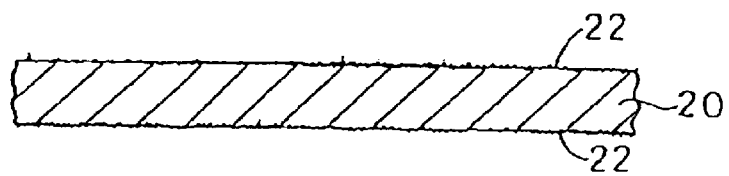
Figure 1:
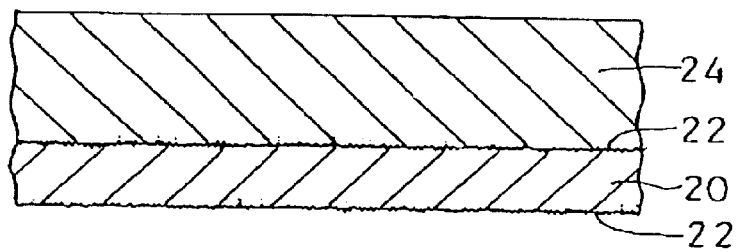
Figure 1:
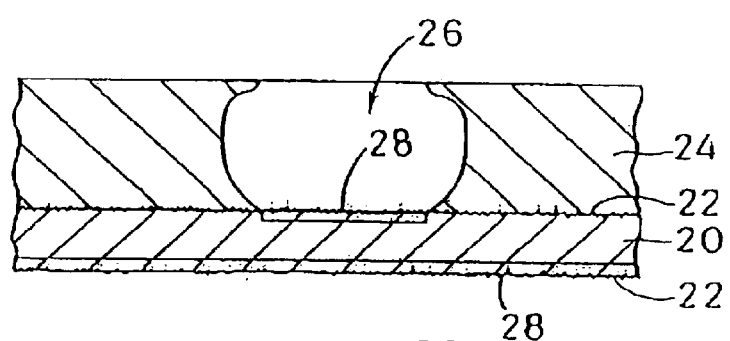
Figure 1:
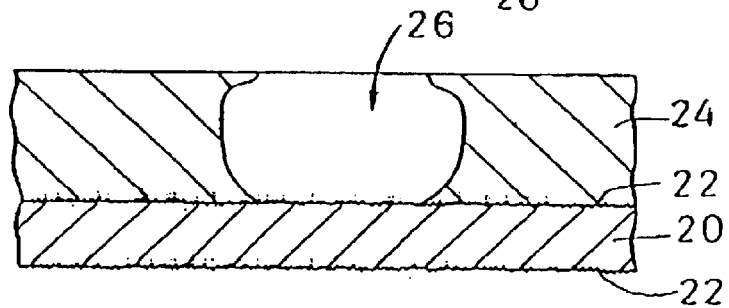

As shown in FIG. 1(a), a metal layer 20 comprised of electrically conductive material is used in the method for producing a double-sided wiring board of the present invention, and surfaces 22 of the metal layer 20 are roughened as shown in FIG. 1(b). The metal layer 20 is a sheet-like or foil-like layer having a thickness of a few to tens of micrometers, and is comprised of electrically good conductors such as copper, aluminum, nickel or the like. Copper is preferably used. Top surface 22 of metal layer 20 is roughened to prevent an insulating layer 24 (FIG. 1(c)) applied over the top surface 22 from being removed (e.g., peeled away) from said surface. Bottom surface 22 is also roughened, as seen in FIG. 1(b).

Normally, the step of roughening surfaces 22 of metal layer 20 is accomplished by executing a reducing process after executing a chemical oxidizing process. As a result of the chemically oxidizing process, extremely fine projections and recesses, each being of order of submicrons, are formed on surfaces 22. If the metal layer 20 is comprised of copper, an oxidizing agent such as sodium chlorite, sodium hypochlorite, potassium chlorate, potassium perchlorate or potassium persulphate can be used for this purpose. The oxidizing process may be accomplished by immersing the metal layer in a solution containing any of the above-cited oxidizing agents, or by spraying the oxidizing solution onto the metal layer. After the surfaces 22 of the metal layer 20 are chemically oxidized, a reducing process is performed by immersing metal layer 20 in an alkaline solution containing a reducing agent. However, it should be understood that metal layer 20 may be roughened by not only applying such a chemically oxidizing process, but also by alternative means, such as acceptable electrical and physical methods. In such cases, a reducing process may not be necessary.

Next, an insulating layer 24 is formed on the top surface 22 of the metal layer 20 by coating the surface with insulating resin, as shown in FIG. 1(c). One or more via holes 26 are formed in the insulating layer 24 at predetermined positions, and the insulating layer 24 is then thermally cured. If a photosensitive insulating resin, such as photosensitive epoxy resin, photosensitive acrylic resin or photosensitive polyimide resin, is used for forming the insulating layer 24, these one or more via holes 26 are formed at predetermined positions primarily by using a photo-etching process. If a thermosetting resin, such as epoxy resin, polyimide resin, or BT resin, is used for forming the insulating layer 24, one or more via holes 26 may be formed at predetermined positions by laser beam machining. As stated, after the via holes 26 are formed, the insulating layer 24 is thermally cured (stabilized).

Following insulating layer thermal cure, the surfaces of the metal layer 20, i.e., the bottom part of the via hole 26 and the back surface (the surface on the other side) of the metal layer 20, which are not covered with the insulating layer 24, are further oxidized by heat to form oxidized layers 28. It is understood from FIG. 1(d) that layer 24 shields much of the surface area on top surface 22 from said heat, leaving only that defined by via hole 28 as the area being subject to further treatment (here, oxidation) at this time. The oxidized layer 28 formed on the back (bottom) surface of metal layer 20 may generate haloing in the subsequent metal-plating process to be performed. For this reason, at least the back surface of the metal layer 20 is reduced as shown in FIG. 1(e). The reduction step is executed by immersing metal layer 20 having insulating layer 24 thereon in an alkaline solution containing a reducing agent or by spraying, showering, or pouring the alkaline solution containing a reducing agent onto the back surface of the metal layer. If metal layer 20 is copper, an alkaline solution containing a reducing agent, which is prepared by dissolving one or more kinds selected from the group of formaline, hypophosphorous acid, sodium hypophosphite, hydrazine hydrochloride, hydrazine sulfate, hydrazine hydrate, or sodium borohydride in aqueous alkaline solution with a pH of about 7 to 13 (prepared by dissolving potassium hydroxide, sodium hydroxide, or the like in water) can be used.

In the above reduction step, the oxidized layer 28 can also be reduced by heating the metal layer 20 on which the insulating layer 24 is located up to a predetermined temperature in a process using a reducing gas (such as hydrogen gas, carbon monoxide gas, or a mixture of said gases). It is the most preferable that the reduction step be executed in an atmosphere comprised only of such reducing gas. However, heat treatment may also be accomplished in an atmosphere of reducing gas and inert gas, or in an atmosphere of a large volume of reducing gas and a small volume of oxygen.

Figure 2:
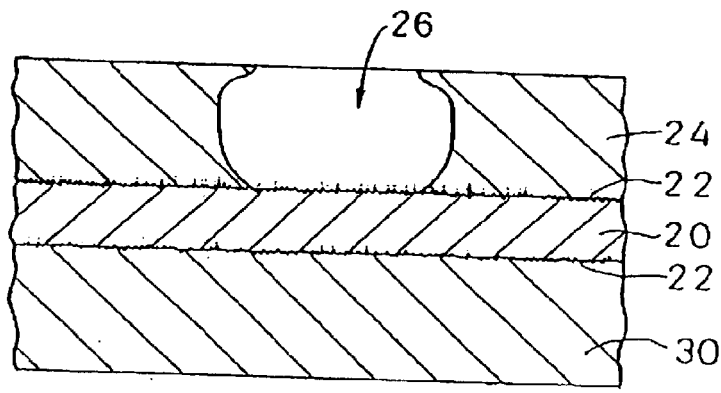
Figure 2:
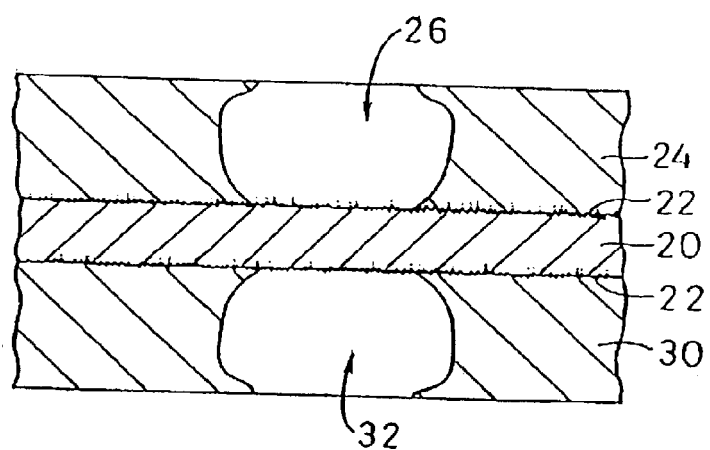
Figure 2:
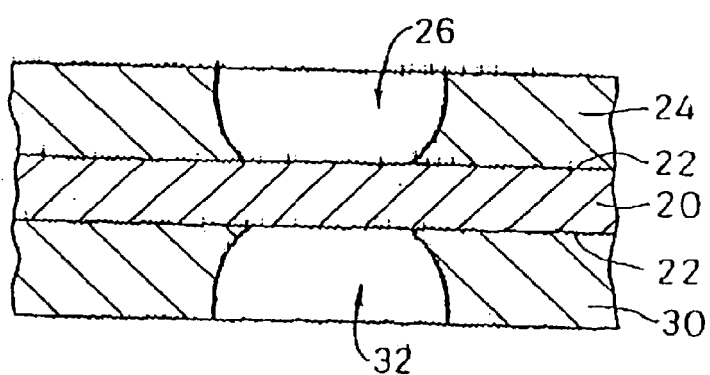

As shown in FIG. 2(a), a step of forming an insulating layer 30 is performed by coating the reduced back surface of metal layer 20 with insulating resin, and then, as shown in FIG. 2(b), forming one or more via holes 32 at predetermined positions within the insulating layer. Laser beam machining is preferably used, as described above, to form these lower holes 32. After these steps, insulating layer 30 is thermally cured. As a result, portions of both surfaces of metal layer 20 that are exposed by the bottom portions of via holes 26 and 32 are oxidized. Therefore, a similar reducing step as described above for eliminating the oxidized layers is performed. It is also possible to prevent oxidation from even occurring, to thermally cure the layer 30 in an atmosphere of inert gas or reducing gas or a mixture of these gases to prevent oxide formation.

In FIG. 2(c), a step of smoothing the surfaces of the cured insulating layers 24 and 30 is performed, preferably by mechanical grinding means, following which the exposed surfaces are roughened again. It should be understood that this step of smoothing surfaces of the insulating layers 24 and 30 is not always necessary. For example, when the sectioned configurations of the via holes 26 and 32 are like bowls (as shown) or another shape that promotes excellent plating, a smoothing step may not be required. In the roughening step, the surfaces of the insulating layers 24 and 30 are etched. The purpose of roughening surfaces of the insulating layers 24 and 30 is to increase adhesive strengths between the insulating layers 24 and 30 and the wiring metal layers (see below) when the wiring metal layers are formed on the surfaces of these insulating layers, e.g., by plating. Therefore, if adhesive strengths between the insulating layers 24 and 30 and the subsequent wiring metal layers are high enough, a step of roughening surfaces of the insulating layers 24 and 30 is not required.

Figure 3:
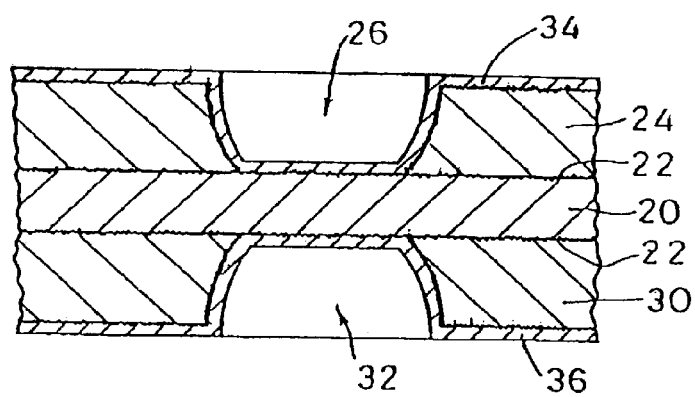
Figure 3:
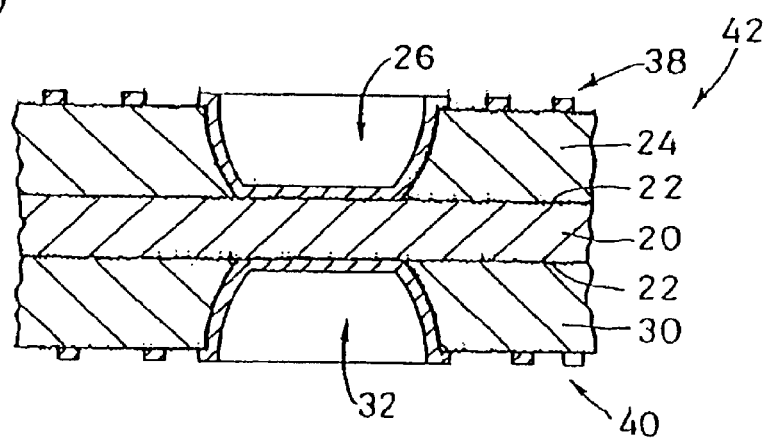

Next, as shown in FIG. 3(a), wiring metal layers 34 and 36 are formed on the surfaces of the insulating layers 24 and 30. In this process, the metal layer 20, having the insulating layers 24 and 30 on its opposed surfaces, is immersed in a plating solution. Since the surface of the metal layer 20, particularly, a part of the metal layer 20 which is exposed by a via hole 32, is not oxidized, the metal layer 20 is not corroded by the plating solution, so that no haloing will result. Therefore, a second copper plating process is not required, if the wiring metal layers 34 and 36 are formed that each have a required minimum thickness. Then, as shown in FIG. 3(b), the wiring metal layers 34 and 36 are formed into circuits 38 and 40 by a photo-etching process to produce a double-sided wiring board 42.

As is clear from the above description, since the plated wiring metal layers 34 and 36 are very thin, the width of each of the circuits 38 and 40 and the space therebetween can be narrowed, producing a high density wiring board structure. Further, since no haloing occurs on the bottom of the via hole 32, spaces between via holes can also be narrowed. Therefore, using the teachings of this invention, it is possible to produce a high density wiring board, while preventing the insulating layer 30 from being peeled from the underlying metal layer 20.

Figure 4:
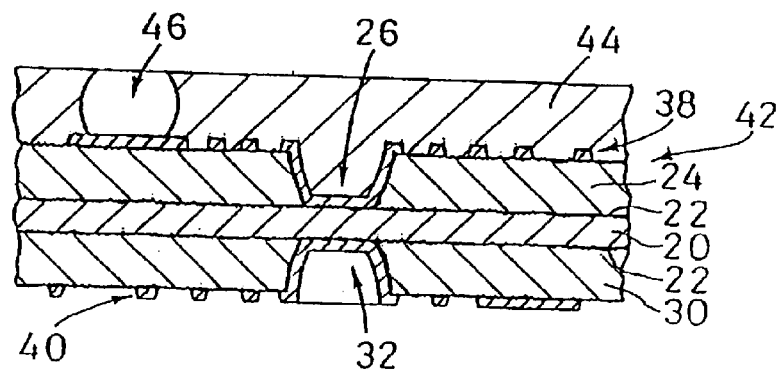
Figure 4:
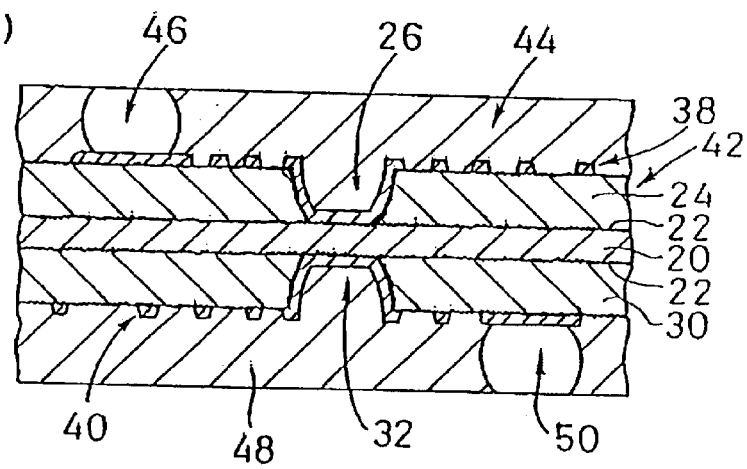
Figure 4:
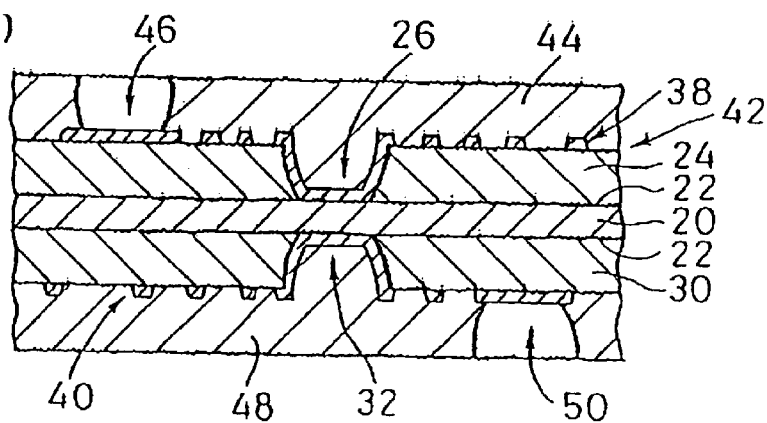
Figure 5:
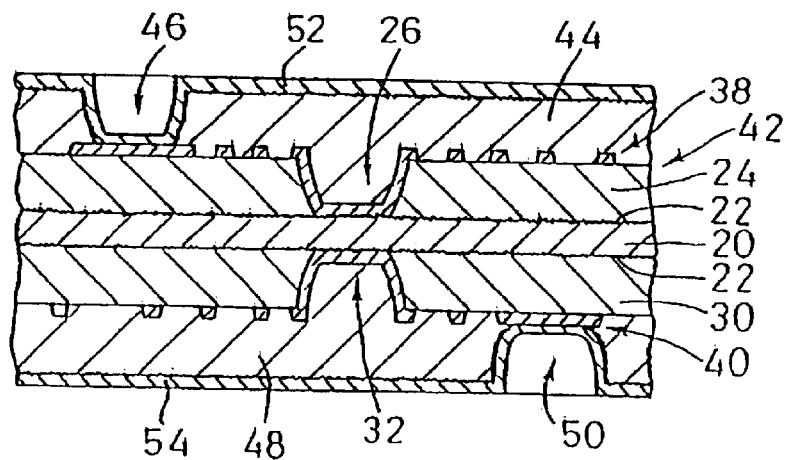
Figure 5:
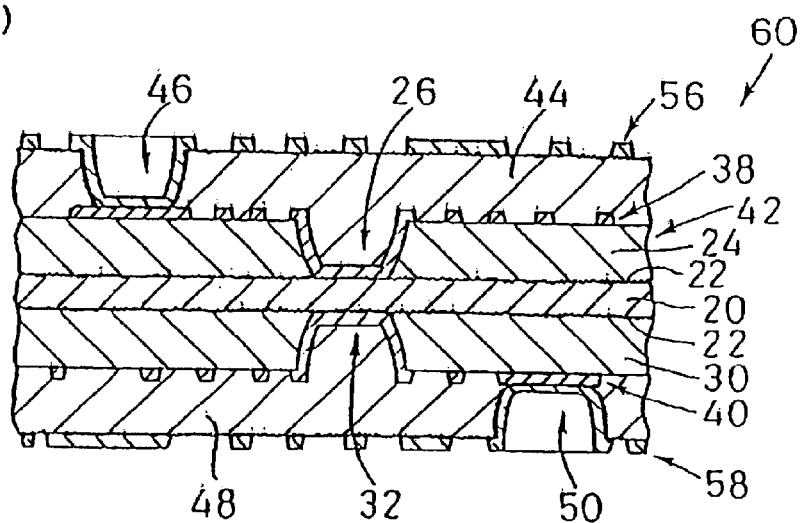

In FIGS. 4 and 5, another embodiment of the invention is illustrated. As shown therein, the method for the present invention can be applied effectively to provide more wiring layers on both surfaces of the double-sided wiring board formed by the method described above with respect to FIGS. 1–3. As shown in FIG. 4(a), an insulating layer 44 is formed on one surface of the double-sided printed wiring board 42 by coating the upper surface of circuit 38 with insulating resin, and then, a via hole 46 is formed at a predetermined position using a conventional method. Then the insulating layer 44 is thermally cured. As a result of the above thermal curing process, the surfaces of circuits 40 formed on the other side of the surface of the double-sided printed wiring board 42 are oxidized. For this reason, as in the above-mentioned embodiment, the oxidized surfaces of the circuits 40 are reduced by: (1) immersing the double-sided printed wiring board 42 in an alkaline solution containing a reducing agent; (2) by spraying, showering, or pouring the alkaline solution containing a reducing agent onto the circuits 40 on the other side of the surface of the double-sided printed wiring board 42; or (3) by heat treating the circuits 40 in a reducing gas. It is also preferable that the exposed surfaces of the double-sided printed wiring board 42 be roughened by applying a conventional method prior to a step of forming the insulating layer 44 on the upper surface of the double-sided printed wiring board in FIG. 4(a).

Next, as shown in. FIG. 4(b), an insulating layer 48 is formed by coating the bottom surfaces of circuits 40 with insulating resin. The reduced circuits 40 provide good wettability and good adhesion to the insulating resin, so that substantially no bubbles are generated in the via hole 32. In addition, as in the above-mentioned embodiment, another via hole 50 is formed at a predetermined position of the insulating layer 48 by applying a conventional method, and then the insulating layer 48 is thermally cured. After this curing, as shown in FIG. 4(c), surfaces of both the cured insulating layers 44 and 48 are smoothened by mechanical grinding means or the like, and then both surfaces are roughened. Processes for smoothing and roughening surfaces of the insulating layers 44 and 48 are not always required, for the reasons stated hereinabove.

As shown in FIG. 5(a), wiring metal layers 52 and 54 are now formed on the external surfaces of insulating layers 44 and 48. In this process, although the double-sided wiring board 42 is immersed in a plating solution, since the surface of the circuit 40 which is exposed by the via hole 50 is not oxidized, the circuit 40 is not corroded by the plating solution, so that no haloing can be generated. Therefore, a second copper plating process is not required, because the wiring metal layers 52 and 54 are so formed that each has a required, minimum thickness. Further, as shown in FIG. 5(b), the produced metal layers 52 and 54 are then formed into circuits 56 and 58 through a conventional photo-etching process, thus producing multilayered double-sided wiring board 60. Further, by applying the same production method as described earlier Above, it is possible to produce an even higher density multilayer double-sided printed wiring board comprising an even greater number of layers, using the multilayer double-sided printed wiring board 60 as a base component, as board 42 served as a base for eventual board 60.

In the embodiment described above, since no haloing is generated at the bottom part of the via hole(s) 50, the wiring metal layer 54 formed at the bottom part of the via hole 50 can be securely connected to the circuit 40, resulting in improved reliability of the final structure. In addition, as described earlier, spaces between adjacent holes can be narrowed. And, since the wiring metal layers 52 and 54 are very thin, the width of each of the circuits 56 and 58, and a space between these can be narrowed. It is, therefore, possible to produce high density wiring. Furthermore, since substantially no bubbles are generated in the via holes, additional processing is not required. Productivity is thus greatly improved.

In the above embodiment, should an oxidized layer be formed on the metal layer 20 or the circuit 40 because of thermal treatment, the oxidized layer is reduced and a plating process can be executed. However, it may be possible to prevent the generation of oxidized layers even in this embodiment. In the production method according to the first embodiment described above, after a step of roughening the surfaces 22 of the metal layer 20, a step of forming an insulating layer 24 is executed by coating one of the surfaces 22 of the metal layer 20 with insulating resin, and then, a further step of forming one or more via holes 26 at predetermined positions of the insulating layer 24 is executed. After that, a step of thermally curing the insulating layer 24 is executed.

In the thermal curing step, the metal layer 20 on which the insulating layer 24 is formed, is heat-treated in an atmosphere of inert gas, reduced gas, or a mixture of these gases so that the metal layer 20 is not oxidized. As inert gas, such gas as nitrogen gas, carbon dioxide gas, or a mixture of these gases can be used. It is preferable that air inside a heating chamber be replaced with inert gas. Such reducing gases as hydrogen gas, carbon monoxide gas or a mixture thereof can be used. It is preferable that a sufficient amount of reducing gas be included in the atmosphere inside a heating chamber so that the metal layer 20 can be reduced rather than oxidized. Further, it may also be practicable that the metal layer 20 is heat-treated by substituting the air inside the heating chamber with a mixture of inert gas and reducing gas. In any case, the surface of the metal layer 20 which is not covered with the insulating layer 24 cannot be oxidized by inert gas or reducing gas, when the insulating layer 24 is thermally cured. The heat-treated metal layer 20 is then cooled down in inert gas or reducing gas to a temperature at which the metal layer 20 cannot be oxidized, even when it is directly contacted with oxygen, and then the metal layer 20 is taken out of the heating chamber.

Next, a step of forming the insulating layer 30 by coating the other surface of the metal layer 20 with insulating resin is performed. After that, a step of forming a via hole 32 in the insulating layer 30 is executed by applying a conventional method, and then a step of thermally curing the insulating layer 30 is executed. In this thermal treatment, as in the above embodiment, the metal layer 20 may be heat treated in inert gas, reducing gas, or a mixture of these gases. However, haloing cannot be generated even when only the bottom part of the via hole 32 surrounded by the insulating layer 30 is oxidized. Therefore, the metal layer 20 can be heat-treated in the air.

As shown in FIG. 2(c), the surfaces of the insulating layers on the cured both surfaces 24 and 30 were smoothened by mechanical grinding means, and then roughened. Wiring metal layers 34 and 36 were then formed on the surfaces of the insulating layers 24 and 30, by a plating process. In this step, the metal layer 20, on which the insulating layers 24 and 30 are formed, is immersed in a plating solution. However, since the metal layer 20, particularly, a part of the metal layer 20 which is exposed by the via hole 32, is not oxidized, the metal layer 20 is not corroded by the plating solution and, thus, no haloing can be generated. Then, the desired wiring metal layers 34 and 36 were formed respectively into the circuits 38 and 40 by photo-etching or the like to produce a double-sided wiring board 42 as seen in FIG. 3(b).

Further, the production method according to the above-described fist embodiment can achieve the same result as the production method according to the second embodiment, also described above. Since a reduction process is not required after a process for thermally curing the insulating layers in the second embodiment, productivity can be improved and production costs can be lowered. In a case where a multilayered double-sided wiring board with more layers is formed, e.g., by using a double-sided wiring board 42 as a base, the insulating layers can be thermally cured in inert gas, reducing gas, or a mixture of these gases, as in the above-mentioned embodiment. In this case, the same result as that of the above embodiment can be achieved.

Figure 6:
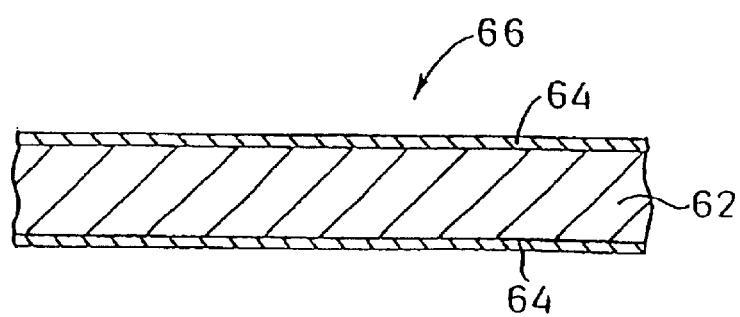
FIG. 6 is an enlarged sectional view to show a double-sided metal-clad laminate board;.
Figure 8:
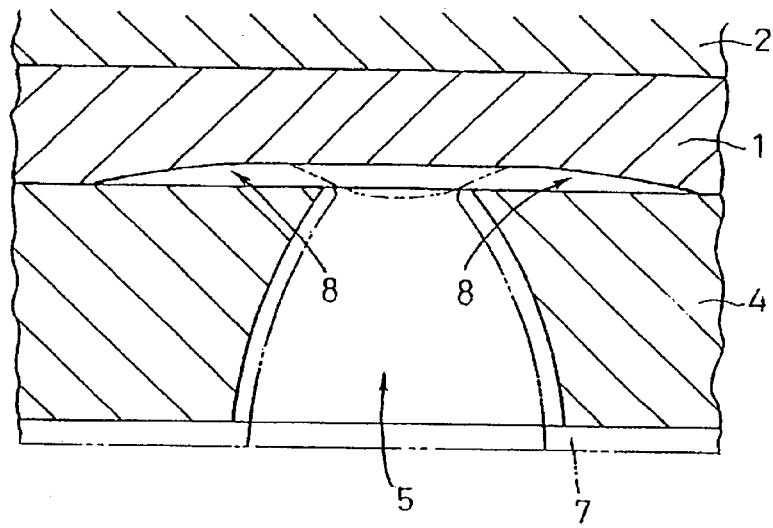
Figure 9:
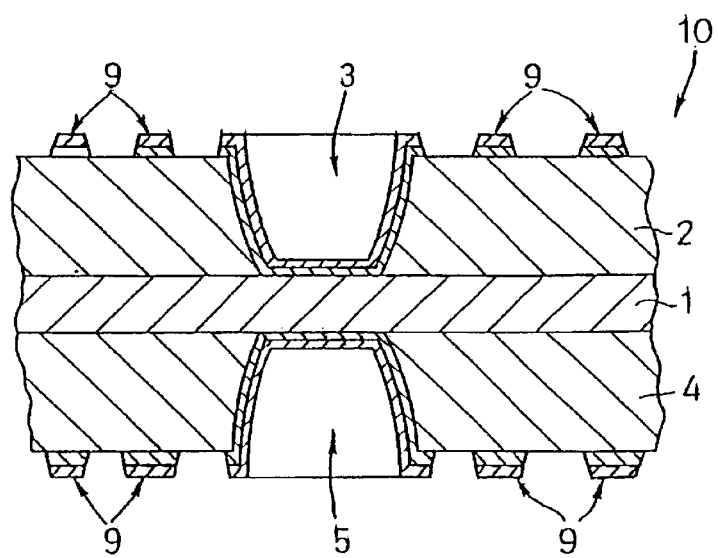
Figure 10:
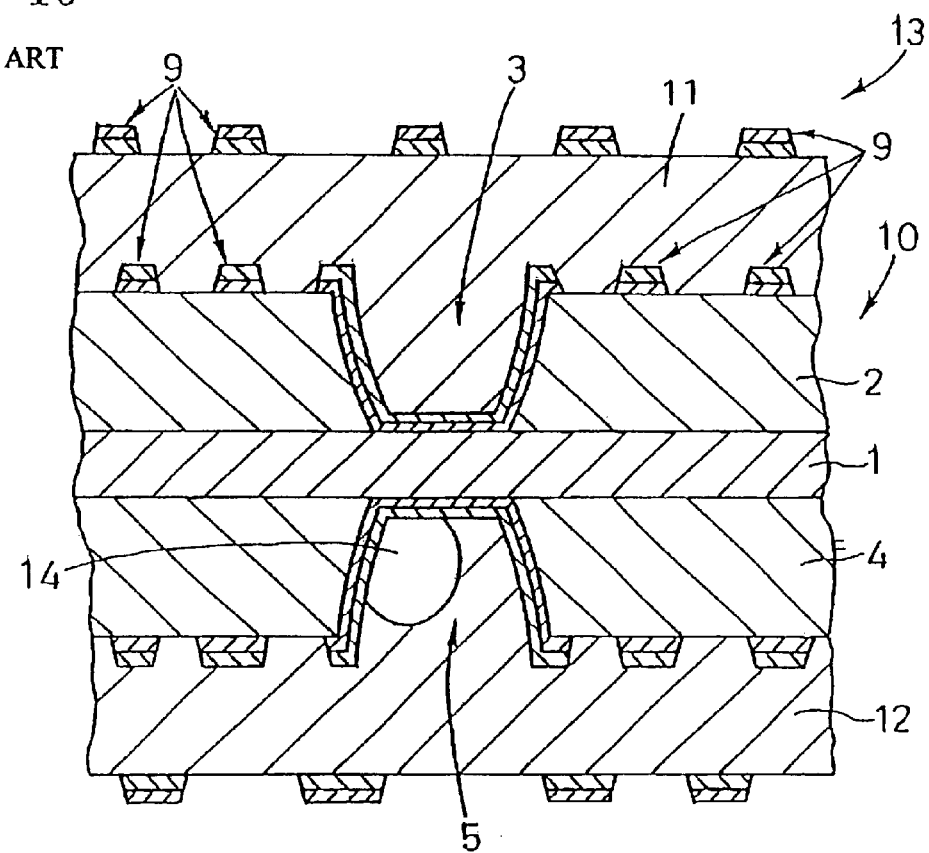
Figure 11:
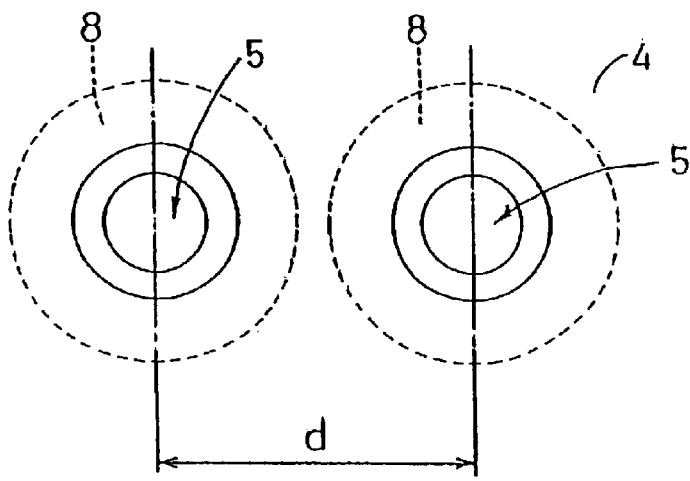
FIG. 11 is an illustration showing the relative spacing between two adjacent via holes.

In the above embodiments, sheet- or foil-like metal layers each comprised of a singular metal may be used as the metal layer 20. However, as shown in FIG. 6, in place of such a single metal layer 20, a double-sided metal-clad laminate 66 wherein conductive layers 64 are laminated on both surfaces of an insulating layer 62 can be used. Generally, as a layer 62, an insulating resin with excellent mechanical property as polyimide resin or polyamide resin is preferred. As a conductive layer 64, copper, silver, or aluminum can be used. The double-sided metal-clad laminate 66 is produced by cladding these metal foils onto both opposing surfaces of the interim resin layer 62 or by evaporating these metals onto both surfaces of the resin layer.

If layer 62 is an insulating layer, it is preferable to form and plate through holes in order to electrically connect the conductive layers 64 on both surfaces of the resin layer 62. It is also practicable to electrically connect the conductive layers 64 by forming the resin layer 67 with electrically conductive resin. In any case, a double-sided metal-clad laminate board 66 can also be used in the same manner as the above-referred metal layer 20.

The method for producing a double-sided wiring board related to the present invention makes it possible to prevent haloing from being generated in the metal plating process. For this reason, a relatively thin metal plating can be achieved. As a consequence, it is possible to form a thinner circuit and to narrow the spaces between via holes.

While there have been shown and described what are at present the preferred embodiments of the invention, it will be obvious to those skilled in the art that various changes and modifications may be made therein without departing from the scope of the invention as defined by the appended claims. For example, an alkaline solution containing a reducing agent may be selected, depending on the metal used for the board's metal layers (or circuits). In addition, reducing gases may be selected according to the kind of metal used for such metal layers or circuits. The invention is understandably not limited to the specific materials described herein.

What is claimed is:

1. A method for producing a double-sided wiring board comprising the steps of:

providing a conductive substrate having first and second opposed conductive surfaces;

forming an insulating layer on said first conductive surface of said substrate;

forming at least one via hole in said first insulating layer on said first conductive surface;

thermally curing said first insulating layer in a reducing gas, inactive gas, or a mixture of these gases so as to prevent an oxidized layer from being formed on said second conductive layer of said substrate during said thermally curing step;

forming a second insulating layer on said second conductive surface of said conductive substrate;

forming at least one via hole in said second insulating layer; and forming conductive wiring on the surfaces of both said first and second insulating layers.

2. The method as defined in claim 1 wherein the gas in which the first insulating layer is cured is a reducing gas.

3. The method as defined in claim 1 wherein the gas in which the first insulating layer is cured is an inactive gas.

4. The method as defined in claim 1 wherein the gas in which the first insulating layer is cured is a mixture of a reducing gas and an inactive gas.

5. The method according to claim 1, further comprising the step of thermally curing said insulating layer on said second conductive surface of said conductive substrate to form a second oxidized layer within said second conductive surface exposed by said at least one via hole formed within said second insulating layer.

6. The method as defined in claim 5 wherein the gas in which the first insulating layer is cured is a reducing gas.

7. The method as defined in claim 5 wherein the gas in which the first insulating layer is cured is an inactive gas.

8. The method as defined in claim 5 wherein the gas in which the first insulating layer is cured is a mixture of a reducing gas and an inactive gas.

9. The method of claim 1 further including the step of roughening said first conductive surface of said conductive substrate prior to forming said first insulating layer on said first conductive surface of said conductive substrate.

10. The method of claim 9 further including the step of smoothening said roughened first conductive surface of said conductive substrate between the step of forming said at least one via hole in said second insulating layer on said second conductive surface and the step of forming said conductive wiring on the surfaces of both said first and second insulating layers.

11. The method of claim 1 wherein said first insulating layer comprises a photosensitive insulating resin.

* * * * *